(12) United States Patent
Bhanot et al.

(10) Patent No.: US 8,095,585 B2
(45) Date of Patent: *Jan. 10, 2012

(54) EFFICIENT IMPLEMENTATION OF MULTIDIMENSIONAL FAST FOURIER TRANSFORM ON A DISTRIBUTED-MEMORY PARALLEL MULTI-NODE COMPUTER

(75) Inventors: Gyan V. Bhanot, Princeton, NJ (US); Dong Chen, Croton-On-Hudson, NY (US); Alan G. Gara, Mount Kisco, NY (US); Mark E. Giampapa, Irvington, NY (US); Philip Heidelberger, Cortlandt Manor, NY (US); Burkhard D. Steinmacher-Burow, Mount Kisco, NY (US); Pavlos M. Vranas, Bedford Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 1074 days.

This patent is subject to a terminal disclaimer.

(21) Appl. No.: 11/931,898

(22) Filed: Oct. 31, 2007

(65) Prior Publication Data

US 2008/0133633 A1 Jun. 5, 2008

Related U.S. Application Data

(63) Continuation of application No. 10/468,998, filed as application No. PCT/US02/05574 on Feb. 25, 2002, now Pat. No. 7,315,877.

(60) Provisional application No. 60/271,124, filed on Feb. 24, 2001.

(51) Int. Cl.
*G06F 17/14* (2006.01)
(52) U.S. Cl. ........................................ 708/401; 708/404
(58) Field of Classification Search ........................ None
See application file for complete search history.

(56) References Cited

U.S. PATENT DOCUMENTS 5,644,517 A 7/1997 Ho
(Continued)

FOREIGN PATENT DOCUMENTS

JP 2000-200261 7/2000

OTHER PUBLICATIONS

Leighton et al., Fast Algorithms for Finding O(Congestion+Dilation) Packet Routing Schedules, Proceedings of the 28th Annual Hawaii International Conference on System Sciences, 1995, pp. 375-401, vol. 19, No. 3.

Grammatikakis et al., Packet Routing in Fixed-Connection Networks: A Survey, Journal of Parallel and Distributed Computing, Nov. 1, 1998, pp. 77-132, vol. 54, No. 2.

(Continued)

*Primary Examiner* — David H Malzahn
(74) *Attorney, Agent, or Firm* — Scully, Scott, Murphy & Presser, P.C.; Daniel P. Morris, Esq.

(57) ABSTRACT

The present in invention is directed to a method, system and program storage device for efficiently implementing a multidimensional Fast Fourier Transform (FFT) of a multidimensional array comprising a plurality of elements initially distributed in a multi-node computer system comprising a plurality of nodes in communication over a network, comprising: distributing the plurality of elements of the array in a first dimension across the plurality of nodes of the computer system over the network to facilitate a first one-dimensional FFT; performing the first one-dimensional FFT on the elements of the array distributed at each node in the first dimension; re-distributing the one-dimensional FFT-transformed elements at each node in a second dimension via "all-to-all" distribution in random order across other nodes of the computer system over the network; and performing a second one-dimensional FFT on elements of the array re-distributed at each node in the second dimension, wherein the random order facilitates efficient utilization of the network thereby efficiently implementing the multidimensional FFT. The "all-to-all" re-distribution of array elements is further efficiently implemented in applications other than the multidimensional FFT on the distributed-memory parallel supercomputer.

33 Claims, 7 Drawing Sheets

U.S. PATENT DOCUMENTS

| | | |
|---|---|---|
| 5,737,628 A | 4/1998 | Birrittella et al. |
| 5,751,616 A | 5/1998 | Hegland et al. |
| 6,073,154 A | 6/2000 | Dick |
| 6,119,140 A | 9/2000 | Murato et al. |
| 6,237,012 B1 | 5/2001 | Ohgose |
| 7,788,310 B2 * | 8/2010 | Eleftheriou et al. ........... 708/401 |
| 2008/0133633 A1 * | 6/2008 | Bhanot et al. ................. 708/404 |

OTHER PUBLICATIONS

Leighton, Methods for Message Routing in Parallel Machines, 24th Annual ACM STOC, 1992, pp. 77-96.

Supplementary European Search Report mailed Feb. 4, 2011 in corresponding International Application No. EP02721139.

* cited by examiner

| A11 | A12 | A13 | A14 | A15 | A16 | A17 | A18 | A19 |
|-----|-----|-----|-----|-----|-----|-----|-----|-----|
| A21 | A22 | A23 | A24 | A25 | A26 | A27 | A28 | A29 |
| A31 | A32 | A33 | A34 | A35 | A36 | A37 | A38 | A39 |
| A41 | A42 | A43 | A44 | A45 | A46 | A47 | A48 | A49 |
| A51 | A52 | A53 | A54 | A55 | A56 | A57 | A58 | A59 |
| A61 | A62 | A63 | A64 | A65 | A66 | A67 | A68 | A69 |
| A71 | A72 | A73 | A74 | A75 | A76 | A77 | A78 | A79 |
| A81 | A82 | A83 | A84 | A85 | A86 | A87 | A88 | A89 |
| A91 | A92 | A93 | A94 | A95 | A96 | A97 | A98 | A99 |

| | | | | | | | | | |
|---|---|---|---|---|---|---|---|---|---|
| Q11 | A11 | A12 | A13 | A14 | A15 | A16 | A17 | A18 | A19 |
| Q12 | A21 | A22 | A23 | A24 | A25 | A26 | A27 | A28 | A29 |
| Q13 | A31 | A32 | A33 | A34 | A35 | A36 | A37 | A38 | A39 |
| Q21 | A41 | A42 | A43 | A44 | A45 | A46 | A47 | A48 | A49 |
| Q22 | A51 | A52 | A53 | A54 | A55 | A56 | A57 | A58 | A59 |
| Q23 | A61 | A62 | A63 | A64 | A65 | A66 | A67 | A68 | A69 |
| Q31 | A71 | A72 | A73 | A74 | A75 | A76 | A77 | A78 | A79 |
| Q32 | A81 | A82 | A83 | A84 | A85 | A86 | A87 | A88 | A89 |
| Q33 | A91 | A92 | A93 | A94 | A95 | A96 | A97 | A98 | A99 |

FIG. 5

| | | | | | | | | | |
|---|---|---|---|---|---|---|---|---|---|
| Q11 | B11 | B12 | B13 | B14 | B15 | B16 | B17 | B18 | B19 |
| Q12 | B21 | B22 | B23 | B24 | B25 | B26 | B27 | B28 | B29 |
| Q13 | B31 | B32 | B33 | B34 | B35 | B36 | B37 | B38 | B39 |
| Q21 | B41 | B42 | B43 | B44 | B45 | B46 | B47 | B48 | B49 |
| Q22 | B51 | B52 | B53 | B54 | B55 | B56 | B57 | B58 | B59 |
| Q23 | B61 | B62 | B63 | B64 | B65 | B66 | B67 | B68 | B69 |
| Q31 | B71 | B72 | B73 | B74 | B75 | B76 | B77 | B78 | B79 |
| Q32 | B81 | B82 | B83 | B84 | B85 | B86 | B87 | B88 | B89 |
| Q33 | B91 | B92 | B93 | B94 | B95 | B96 | B97 | B98 | B99 |

FIG. 6 — 600

|     | | | | | | | | | |
|-----|-----|-----|-----|-----|-----|-----|-----|-----|-----|
| Q11 | B11 | B21 | B31 | B41 | B51 | B61 | B71 | B81 | B91 |
| Q12 | B12 | B22 | B32 | B42 | B52 | B62 | B72 | B82 | B92 |
| Q13 | B13 | B23 | B33 | B43 | B53 | B63 | B73 | B83 | B93 |
| Q21 | B14 | B24 | B34 | B44 | B54 | B64 | B74 | B84 | B94 |
| Q22 | B15 | B25 | B35 | B45 | B55 | B65 | B75 | B85 | B95 |
| Q23 | B16 | B26 | B36 | B46 | B56 | B66 | B76 | B86 | B96 |
| Q31 | B17 | B27 | B37 | B47 | B57 | B67 | B77 | B87 | B97 |
| Q32 | B18 | B28 | B38 | B48 | B58 | B68 | B78 | B88 | B98 |
| Q33 | B19 | B29 | B39 | B49 | B59 | B69 | B79 | B89 | B99 |

FIG. 7 — 700

|     | | | | | | | | | |
|-----|-----|-----|-----|-----|-----|-----|-----|-----|-----|
| Q11 | C11 | C21 | C31 | C41 | C51 | C61 | C71 | C81 | C91 |
| Q12 | C12 | C22 | C32 | C42 | C52 | C62 | C72 | C82 | C92 |
| Q13 | C13 | C23 | C33 | C43 | C53 | C63 | C73 | C83 | C93 |
| Q21 | C14 | C24 | C34 | C44 | C54 | C64 | C74 | C84 | C94 |
| Q22 | C15 | C25 | C35 | C45 | C55 | C65 | C75 | C85 | C95 |
| Q23 | C16 | C26 | C36 | C46 | C56 | C66 | C76 | C86 | C96 |
| Q31 | C17 | C27 | C37 | C47 | C57 | C67 | C77 | C87 | C97 |
| Q32 | C18 | C28 | C38 | C48 | C58 | C68 | C78 | C88 | C98 |
| Q33 | C19 | C29 | C39 | C49 | C59 | C69 | C79 | C89 | C99 |

EFFICIENT IMPLEMENTATION OF MULTIDIMENSIONAL FAST FOURIER TRANSFORM ON A DISTRIBUTED-MEMORY PARALLEL MULTI-NODE COMPUTER

CROSS-REFERENCE TO RELATED APPLICATIONS

This application is a continuation of U.S. application Ser. No. 10/468,998 filed on Aug. 22, 2003, now U.S. Pat. No. 7,315,877, which is a national stage application under 35 U.S.C. §371 of International Application No. PCT/US02/05574 filed on Feb. 25, 2002. That application claims benefit of United States Provisional Patent Application Ser. No. 60/271,124 filed Feb. 24, 2001 entitled MASSIVELY PARALLEL SUPERCOMPUTER. That parent patent application is additionally related to the following commonly-owned United States Patent Applications filed on the same date, the entire contents and disclosure of each of which is expressly incorporated by reference herein as if fully set forth herein. U.S. patent application Ser. No. 10/468,999, now U.S. Pat. No. 7,587,516, for "Class Networking Routing"; U.S. patent application Ser. No. 10/469,000, now U.S. Pat. No. 7,650,434, for "A Global Tree Network for Computing Structures Enabling Global Processing Operations"; U.S. patent application Ser. No. 10/468,997, now U.S. Pat. No. 7,444,385, for 'Global Interrupt and Barrier Networks"; U.S. patent application Ser. No. 10/469,001, now U.S. Pat. No. 7,305,487, for 'Optimized Scalable Network Switch"; U.S. patent application Ser. No. 10/468,991, now U.S. Pat. No. 7,313,582, for "Arithmetic Functions in Torus and Tree Networks'; International Application No. US02/05568, for 'Data Capture Technique for High Speed Signaling"; U.S. patent application Ser. No. 10/468,995, now U.S. Pat. No. 7,870,343, for 'Managing Coherence Via Put/Get Windows'; U.S. patent application Ser. No. 10/468,994, now U.S. Pat. No. 7,174,434, for "Resorce Locking In A Multiprocessor System"; U.S. patent application Ser. No. 10/468,990, now U.S. Pat. No. 7,330,996, for 'Twin-Tailed Fail-Over for Fileservers Maintaining Full Performance in the Presence of a Failure"; U.S. patent application Ser. No. 10/468,996, now U.S. Pat. No. 7,210,088, for "Fault Isolation Through No-Overhead Link Level'CRC; U.S. patent application Ser. No. 10/469,003, U.S. Patent Application Publication No. 2004-0083293, for "Ethernet Addressing Via Physical Location for Massively Parallel Systems"; U.S. patent application Ser. No. 10/469,002, now U.S. Pat. No. 7,185,226, for "Fault Tolerance in a Supercomputer Through Dynamic Repartitioning"; U.S. patent application Ser. No. 10/258,515, now U.S. Pat. No. 6,895,416, for "Checkpointing Filesystem"; U.S. patent application Ser. No. 10/468,998, now U.S. Pat. No. 7,315,877, for "Efficient Implementation of Multidimensional Fast Fourier Transform on a Distributed-Memory Parallel Multi-Node Computer"; U.S. patent application Ser. No. 10/468,993, now U.S. Pat. No. 7,555,566, for "Novel Massively Parallel Supercomputer"; and U.S. patent application Ser. No. 10/083,270, now U.S. Pat. No. 6,592,449, for "Smart Fan Modules and System".

STATEMENT REGARDING FEDERALLY SPONSORED RESEARCH OR DEVELOPMENT

This invention was made with Government support under subcontract number B517552 under prime contract number W-7405-ENG-48 awarded by the Department of Energy. The Government has certain rights in this invention.

BACKGROUND OF THE INVENTION

1. Technical Field of the Invention

The present invention generally relates to a field of distributed-memory message-passing parallel multi-node computers and associated system software, as applied for example to computations in the fields of science, mathematics, engineering and the like. More particularly, the present invention is directed to a system and method for efficient implementation of a multidimensional Fast Fourier Transform (i.e., "FFT") on a distributed-memory parallel supercomputer.

2. Description of the Prior Art

Linear transforms, such as the Fourier Transform (i.e., "FT"), have widely been used for solving a range of problems in the fields of science, mathematics, engineering and the like. The FT alters a given problem into one that may be more easily solved, and the FT is used in many different applications. For example, for a system of N variables, the FT essentially represents a change of the N variables from coordinate space to momentum space, where the new value of each variable depends on the values of all the old variables. Such a system of N variable is usually stored on a computer as an array of N elements. The FT is commonly computed using the Fast Fourier Transform (i.e., "FFT"). The FFT is described in many standard texts, such as the Numerical Recipes by Press, et al. ("Numerical Recipes in Fortran", pages 490-529, by W. H. Press, S. A. Teukolsky, W. A. Vetterling and Brian P Flannery, Cambridge University Press, 1986, 1992, ISBN: 0-521-43064-X). Most computer manufacturers provide library function calls to optimize the FFT for their specific processor. For example, the FET is fully optimized on the IBM's RS/6000 processor in the Engineering and Scientific Subroutine Library. These library routines require the data (i.e., the foregoing elements) necessary to perform the FFT be resident in a memory local to a node.

In a multidimensional FFT, N elements of a multidimensional array are distributed in a plurality of dimensions across nodes of a distributed-memory parallel multi-node computer. Many applications that execute on distributed-memory parallel multi-node computers spend a large fraction of their execution time on calculating the multidimensional FFT. Since a motivation for the distributed-memory parallel multi-node computers is faster execution, fast calculation of the multidimensional FFT for the distributed array is of critical importance. The N elements of the array are initially distributed across the nodes in some arbitrary fashion particular to an application. To calculate the multidimensional FFT, the array of elements is then redistributed such that a portion of the array on each node consists of a complete row of elements in the x-dimension. A one-dimensional FFT on each row in the x-dimension on each node is then performed. Since the row is local to a node and since each one-dimensional FFT on each row is independent of the others, the one-dimensional FFT performed on each node requires no communication with any other node and may be performed using abovementioned library routines. After the one-dimensional FFT, the array elements are re-distributed such that a portion of the array on each node consists of a complete row in the y-dimension. Thereafter, a one-dimensional FFT on each row in the y-dimension on each node is performed. If there are more than two dimensions for the array, then the re-distribution and a one-dimensional FFT are repeated for each successive dimension of the array beyond the x-dimension and the y-dimension. The resulting array may be re-distributed into some arbitrary fashion particular to the application.

The treatment of the x-dimension and the y-dimension in sequence is not fundamental to the multidimensional FFT. Instead, the dimensions of the array may be treated in any order. For some applications or some computers, some orders may take advantage of some efficiency and thus have a faster execution than other orders. For example, the initial distribution of the array across the nodes, which is in some arbitrary fashion particular to the application, may coincide with the distribution necessary for the one-dimensional FFTs in the y-dimension. In this case, it may be fastest for the multidimensional FFT to treat the y-dimension first, before treating the x-dimension and any other remaining dimensions.

In the implementation of the multidimensional FFT described above, each re-distribution of the array between the one-dimensional FFTs is an example of an "all-to-all" communication or re-distribution. In the all-to-all re-distribution, each node of the distributed-memory parallel multi-node computer sends unique data (i.e., elements of the array) to all other nodes utilizing a plurality of packets. As above-mentioned, fast calculation of the multidimensional FFT on the distributed-memory parallel multi-node computer, is of critical importance. In the implementation described above, typically a large fraction of the execution time is spent to re-distribute the array across the nodes of the distributed-memory parallel multi-node computer. More particularly, a large fraction of execution time is spent on the "all-to-all" re-distribution of elements of the array across the nodes of the distributed-memory parallel multi-node computer.

Therefore there is a need in the art for providing a system and method for efficiently implementing the multidimensional FFT on the distributed-memory parallel supercomputer. In particular, there is a need in the art for providing a system and method for efficiently implementing the "all-to-all" re-distribution on the distributed-memory parallel supercomputer for efficiently implementing the multidimensional FFT.

SUMMARY OF THE INVENTION

It is therefore an object of the present invention to provide a system and method for efficiently implementing the multi-dimensional FFT on an array distributed on a distributed-memory parallel supercomputer.

It is another object of the present invention to provide a system and method for efficiently implementing the multidimensional FFT on the array by efficiently implementing the "all-to-all" re-distribution on the distributed-memory parallel supercomputer.

It is yet another object of the present invention to provide a system and method for efficiently implementing the "all-to-all" re-distribution in applications other than the multidimensional FFT on the distributed-memory parallel supercomputer.

According to an embodiment of the present invention, there is provided a method for efficiently implementing a multidimensional Fast Fourier Transform (FFT) of a multi-dimensional array comprising a plurality of elements initially distributed in a multi-node computer system comprising a plurality of nodes in communication over a network, the method comprising: distributing the plurality of elements of the array in a first dimension across the plurality of nodes of the computer system over the network to facilitate a first one-dimensional FFT; performing the first one-dimensional FFT on the elements of the array distributed at each node in the first dimension; re-distributing the one-dimensional FFT-transformed elements at each node in a second dimension via "all-to-all" distribution in random order across other nodes of the computer system over the network; and performing a second one-dimensional FFT on elements of the array re-distributed at each node in the second dimension, wherein the random order facilitates efficient utilization of the network thereby efficiently implementing the multidimensional FFT.

According to another embodiment of the present invention, there is provided a system for efficiently implementing a multidimensional Fast Fourier Transform (FFT) of a multi-dimensional array comprising a plurality of elements initially distributed in a multi-node computer system comprising a plurality of nodes in communication over a network, the system comprising: means for distributing the plurality of elements of the array in a first dimension across the plurality of nodes of the computer system over the network to facilitate a first one-dimensional FFT; means for performing the first one-dimensional FFT on the elements of the array distributed at each node in the first dimension; means for re-distributing the one-dimensional FFT-transformed elements at each node in a second dimension via "all-to-all" distribution in random order across other nodes of the computer system over the network; and means for performing a second one-dimensional FFT on elements of the array re-distributed at each node in the second dimension, wherein the random order facilitates efficient utilization of the network thereby efficiently implementing the multidimensional FFT.

According to yet another embodiment of the present invention, there is provided a program storage device, tangibly embodying a program of instructions executable by a machine to perform a method for efficiently implementing a multidimensional Fast Fourier Transform (FFT) of a multi-dimensional array comprising a plurality of elements initially distributed in a multi-node computer system comprising a plurality of nodes in communication over a network, the method comprising: distributing the plurality of elements of the array in a first dimension across the plurality of nodes of the computer system over the network to facilitate a first one-dimensional FFT; performing the first one-dimensional FFT on the elements of the array distributed at each node in the first dimension; re-distributing the one-dimensional FFT-transformed elements at each node in a second dimension via "all-to-all" distribution in random order across other nodes of the computer system over the network; and performing a second one-dimensional FFT on elements of the array re-distributed at each node in the second dimension, wherein the random order facilitates efficient utilization of the network thereby efficiently implementing the multidimensional FFT.

According to a further embodiment of the present invention, there is provided a method for efficiently re-distributing a multidimensional array comprising a plurality of elements initially distributed in a multi-node computer system comprising a plurality of nodes in communication over a network, the method comprising re-distributing the elements at each node via "all-to-all" distribution in random order across other nodes of the computer system over the network, wherein the random order facilitates efficient utilization of the network.

According to yet a further embodiment of the present invention, there is provided a system for efficiently re-distributing a multidimensional array comprising a plurality of elements initially distributed in a multi-node computer system comprising a plurality of nodes in communication over a network, the system comprising a means for re-distributing the elements at each node via "all-to-all" distribution in random order across other nodes of the computer system over the network, wherein the random order facilitates efficient utilization of the network.

According to still a further embodiment of the present invention, there is provided a program storage device, tangibly embodying a program of instructions executable by a machine to perform a method for efficiently re-distributing a multidimensional array comprising a plurality of elements initially distributed in a multi-node computer system comprising a plurality of nodes in communication over a network, the method comprising re-distributing the elements at each node via "all-to-all" distribution in random order across other nodes of the computer system over the network, wherein the random order facilitates efficient utilization of the network.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION OF THE REFERRED EMBODIMENT OF THE INVENTION

The present invention is directed to a system and method for efficiently implementing the multidimensional Fast Fourier Transform (i.e., "FFT") on the distributed-memory parallel supercomputer. More particularly, the present invention implements an efficient "all-to-all" re-distribution of elements distributed at nodes of the distributed-memory parallel supercomputer to achieve an efficient implementation of the multidimensional FFT.

According to the present invention, the FFT is implemented on the distributed-memory parallel supercomputer, as a series of one-dimensional transforms, which require one or more "all-to-all" re-distributions of a multidimensional array across the nodes of the distributed-memory parallel supercomputer. The distributed-memory parallel supercomputer utilizes a Torus-based network for the interconnection of and communication between nodes of the supercomputer. As will be described below, each node implements a hardware router for efficiently routing packets that include elements of the array across the nodes of the supercomputer interconnected via the Torus-based network. Therefore, the present invention couples the implementation of the multidimensional FFT as a series of one-dimensional transforms of the multi-dimensional array with the foregoing hardware routing to obtain the efficient FFT implementation according to the present invention.

Further according to the present invention, the distributed-memory parallel supercomputer comprises a plurality of nodes, each of which includes at least one processor that operates on a local memory. The nodes are interconnected as a multidimensional grid and they communicate via grid links. Without losing generality and in order to make the description of this invention easily understandable to one skilled in the art, the multidimensional node grid of the supercomputer will be described as an exemplary 2-dimensional grid. Notwithstanding the fact that only the 2-dimensional node grid is described in the following description, it is contemplated within the scope of the present invention that node grids of other dimensions may easily be provided based on the teachings of the present invention. It is noted that the distributed-memory parallel supercomputer may utilize a 3-dimensional or greater Torus-based architecture. Additionally, without losing generality and in order to make the description of this invention easily understandable to one skilled in the art, the multidimensional array used by the multidimensional FFT will be described as an exemplary 2-dimensional array. Notwithstanding the fact that only the 2-dimensional array is described in the following description, it is contemplated within the scope of the present invention that arrays of additional dimensions may easily be provided based on the teachings of the present invention. It is further noted that there is no correspondence between the number of dimensions in the Torus-based architecture and the number of dimensions in the array. The array must be of sufficient size such that it can be distributed across the nodes or a subset of the nodes of the supercomputer for implementing the multidimensional FFT according to the present invention.

Figure 1:
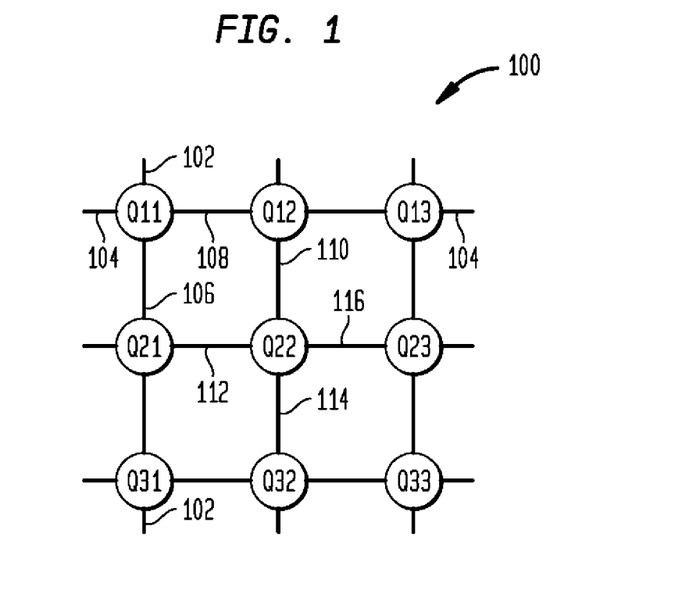
FIG. 1 illustrates an exemplary distributed-memory parallel supercomputer that includes 9 nodes interconnected via a multidimensional grid utilizing a 2-dimensional 3×3 Torus network according to the present invention.

FIG. 1 is an exemplary illustration of distributed-memory parallel supercomputer that includes 9 nodes interconnected via a multidimensional grid utilizing a 2-dimensional 3×3 Torus network 100, according to the present invention. It is noted that the number of nodes is in exemplary fashion limited to 9 nodes for brevity and clarity, and that the number of nodes may significantly vary depending on a particular architectural requirements for the distributed-memory parallel supercomputer. FIG. 1 depicts 9 nodes labeled as Q11-Q33, a pair of which is interconnected by a grid link. In total, the 9-node Torus network 100 is interconnected by 18 grid links, where each node is directly interconnected to four other nodes in the Torus network 100 via a respective grid link. It is noted that unlike a mesh, the exemplary 2-dimensional Torus network 100 includes no edge nodes. For example, node Q11 is interconnected to node Q31 via grid link 102; to node Q13 via grid link 104; to node Q21 via grid link 106; and finally to node Q12 via grid link 108. As another example, Node Q22 is interconnected to Node Q12 via grid link 110; to node Q21 via grid link 112; to node Q32 via grid link 114 and finally to Node Q23 via grid link 116. Other nodes are interconnected in a similar fashion.

Further with reference to FIG. 1, data (i.e., elements of the array) communicated between nodes is transported on the network in one or more packets. For any given communication between a pair of nodes, a plurality of packets are required if the amount of data to be communicated exceeds the packet-size supported by the Torus network 100. A packet comprises a packet header and the data carried by the packet. The packet header includes information required by the Torus network 100 to transport the packet from a source node to a destination node. In the distributed-memory parallel supercomputer of the present patent application, each node on the network is identified by a logical address and the packet header includes a destination address so that the packet is automatically routed to a node on the network as identified by a destination.

Figure 2:
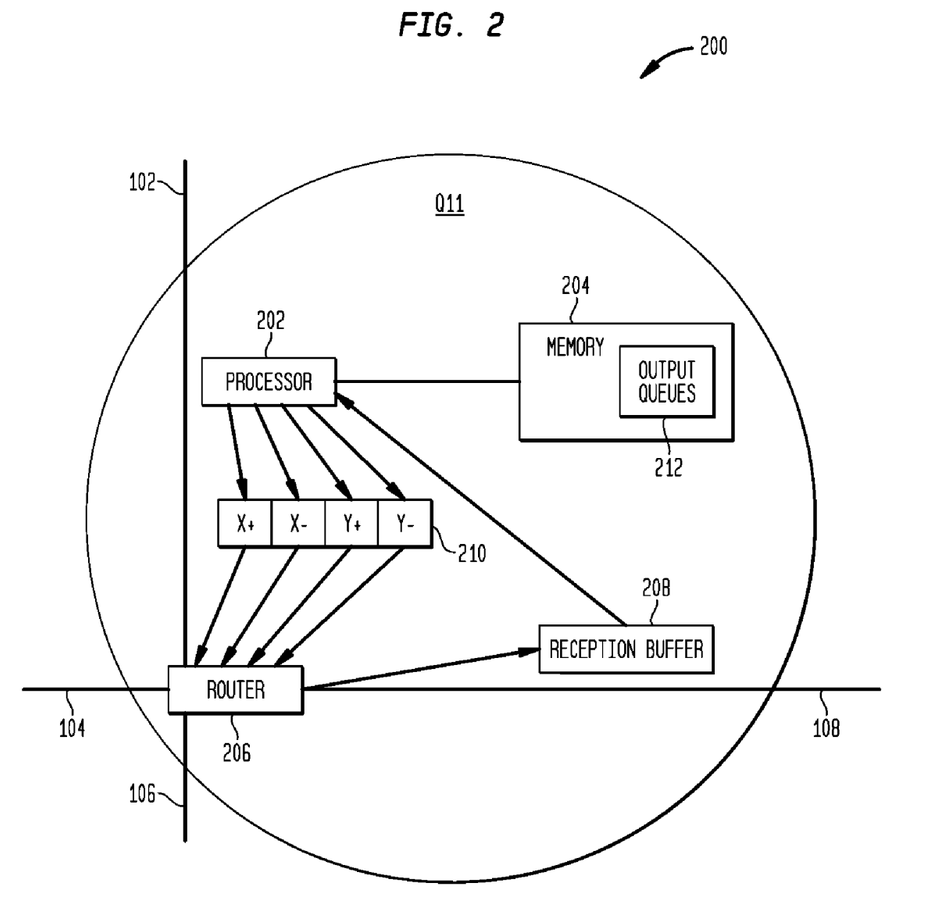
FIG. 2 illustrates a more detailed representation of an exemplary node from the distributed-memory parallel supercomputer of FIG. 1 according to the present invention.

FIG. 2 is a more detailed representation 200 of an exemplary node, e.g., node Q11, from the distributed-memory parallel supercomputer of FIG. 1 according to the present invention. The node Q11 comprises at least one processor 202 that operates on local memory 204. The node further comprises a router 206 that routes, i.e., sends and receives, packets on the grid links 102,104,106 and 108, which connect the node Q11 to its neighboring nodes Q31, Q13, Q21 and Q12, respectively, as particularly illustrated in FIG. 1. Yet further, the node comprises a reception buffer 208 for buffering packets received by the router 206, which are destined for the local processor 202. The local processor 202 may easily periodically poll the reception buffer 208 in order to determine if there are packets in the reception buffer and then retrieve the packets that are buffered in the reception buffer 208. Depending on a particular application and the packets, the local processor 202 may write the contents of the packets into memory 204.

Further with reference to FIG. 2, the node Q11 comprises four injection First-In-First-Out (i.e., "FIFO") buffers 810, which are particularly labeled X+, X−, Y+ and Y−. The processor places outbound packets into one or more output queues 212 of the local memory 2104, which store packets destined for other nodes until they can be placed into the injection FIFOs 210. While injection FIFOs are not full, the processor places outbound packets into the injection FIFOs 210. Upon a particular packet reaching the head of an injection FIFO 210, the packet is removed from the injection FIFO 210 by the router 206 and the router 206 inserts the packet onto a grid link 102,104,106 and 108 toward a destination node for the particular packet. The four injection FIFOs 210 are treated equivalently by the router 206 and by the hardware of the local processor 202.

Yet further with reference to FIG. 2, the router 206 comprises several simultaneous routing characteristics. The routing first represents virtual cut-through routing. For example, if an incoming packet on one of the grid links is not destined for the local processor 202 of node Q11, then the router 206 forwards the packet onto one of the outgoing grid links 102, 104, 106 and 108. The router 206 performs the forwarding without involving the local processor 202. The routing further represents shortest-path routing. For example, a packet sent by node Q11 to node Q13 (See FIGS. 1 and 8) that travels over the grid link 104 represents a shortest path route. Any other path would by longer. As another example, a packet sent by node Q11 to node Q22 may travel over grid links 106 and 112 or alternatively over grid links 108 and 110. This type of routing is represents an adaptive type of routing. Thus, there may be a choice of grid links by which a packet may leave a node in transit for another node over the Torus-based network 100. In the previous example, the packet may leave the node Q11 via the grid link 106 or 108. Adaptive routing allows the router 206 to choose the less busy outgoing grid link for a packet or to choose the outgoing grid link based on some other criteria. It is noted that the adaptive routing is not just performed at the source node of a packet, e.g., node Q11, but is performed at each intermediate node that a packet cuts through on the way to the packet's destination node over the Torus-based network 100 of FIG. 1. The description below with reference to FIGS. 9 and 10 particularly describes how the present invention performs the foregoing routing of packets across the nodes of the supercomputer over the Torus network 100.

Figure 3:
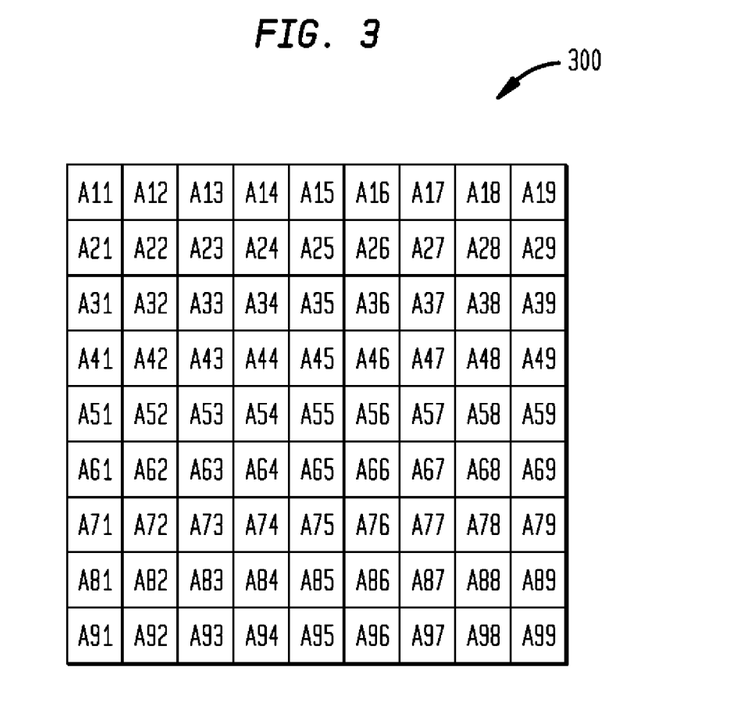
FIG. 3 illustrates an exemplary two-dimensional 9-row by 9-column array, which may efficiently be implemented for the multidimensional FFT according to the present invention.

FIG. 3 is an exemplary two-dimensional 9-row by 9-column array 300 that includes 81 elements, which may efficiently be implemented for the multidimensional FFT according to the present invention. It is noted that the exemplary two-dimensional array 300 is easily extended to other two-dimensional arrays including a different number of rows and columns (e.g., 10-row by 11-column two-dimensional array), which may be utilized for implementing the FFT on the distributed-memory parallel supercomputer according to the present invention. In the array 200, the first row of the array comprises elements A11, A12 . . . A19, while the first column of the array comprises elements A11, A21 . . . A 91.

Figure 4:
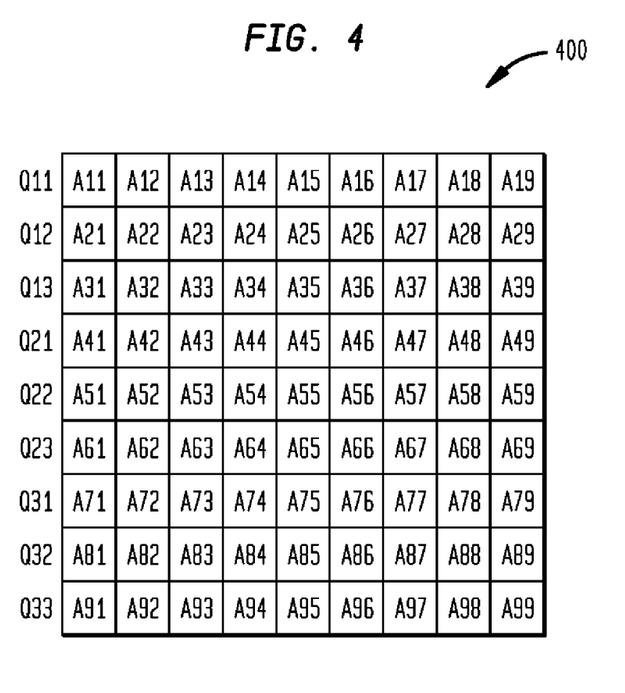
FIG. 4 illustrates an exemplary distribution the two-dimensional array of FIG. 3 across the nodes of the supercomputer in FIG. 1 according to the present invention.

FIG. 4 is an exemplary distribution illustration 400 of how the two-dimensional array 300 of FIG. 3 is distributed across the nodes Q11-Q33 in FIG. 1 according to the present invention. It is noted that the array may initially be distributed across the nodes in some arbitrary fashion that is particular to an application. According to present invention, the array re-distributed such that a portion of the array on each node Q11 . . . Q33 comprises the distribution illustrated in FIG. 4. This re-distribution is similar to that described below with reference to FIGS. 5 and 6. As particularly depicted in the distribution illustration 400, each node of FIG. 1 includes a portion of the two-dimensional array 300 of FIG. 3. For example, node Q11 comprises the first row of the array 300, i.e., elements A11, A12 . . . A19. As another example, node Q12 comprises the second row of the array 300, i.e., elements A21, A22 . . . A23. It is noted that other nodes Q13-Q33 of FIG. 1 comprise respective rows 3 through 9 of array 300, as particularly depicted in distribution illustration 400 of FIG. 4. In exemplary distribution of FIG. 4, the assignment of a particular node to a particular row of array elements is not fundamental. Instead, it is noted that any assignment is feasible. For various applications and/or computers, some assignments may take advantage of efficiencies offered by the applications and/or computers and thus produce faster execution than other assignments. For example, it may be that the fastest way to perform the multidimensional FFT may be to reverse the assignments of nodes Q11 and Q12 from those illustrated in FIG. 4.

Figure 5:
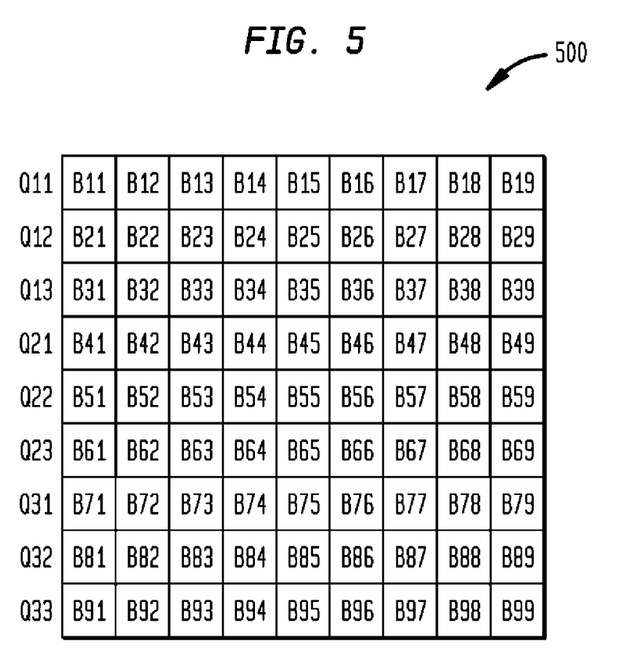
FIG. 5 illustrates an exemplary first one-dimensional FFT of the two-dimensional array distributed across the nodes of the supercomputer of FIG. 1 according to the present invention.

FIG. 5 is an exemplary illustration 500 that depicts a first one-dimensional FFT on the two-dimensional array of FIG. 4 that was distributed across the nodes Q11-Q33 over the two-dimensional Torus network 100 of FIG. 1. As particularly noted above, the multidimensional FFT according to the present invention is accomplished by performing a series of one-dimensional FFTs. Thus according to the present invention, the multi-dimensional FFT of the two-dimensional array 300 may be implemented as a series of one-dimensional FFTs. Therefore, a one-dimensional FFT is performed on each row of elements distributed at each node. For example, a one-dimensional FFT is performed for the elements distributed at node Q11, i.e., elements in the first row of array 300 that were distributed to node Q11. One-dimensional FFTs are performed for elements (i.e., rows of elements) at each node Q12-Q33. The result is an array of elements transformed by the first one-dimensional FFT. More particularly, the result of the one-dimensional FFT on each row at each node is a row of the same length as particularly illustrated in FIG. 5. For example, a one-dimensional FFT performed on the first row at node Q11 of FIG. 4, which comprises elements A11, A12 ... A19, results in a first row at node Q11 of FIG. 5, which comprises elements B11, B12 ... B19. Furthermore, the one-dimensional FFT performed on each row at each node is independent of the one-dimensional FFT performed on any other row at another node. The particular distribution of data illustrated in FIG. 4 enables each node to perform the one-dimensional FFT on the row of elements distributed at that node, without communication with any other node on the Torus network 100 of FIG. 1. Therefore, since no communication is required between the nodes, these one-dimensional FFTs are performed fast. It is noted that at each node, in addition to the resulting row in FIG. 5, the original row in FIG. 4 may continue to exist and be of interest for a particular application, but the original row is no longer needed for the second one-dimensional FFT in the series of FFTs required for the multidimensional FFT according to the present invention, as particularly illustrated in FIGS. 6 and 7.

Figure 6:
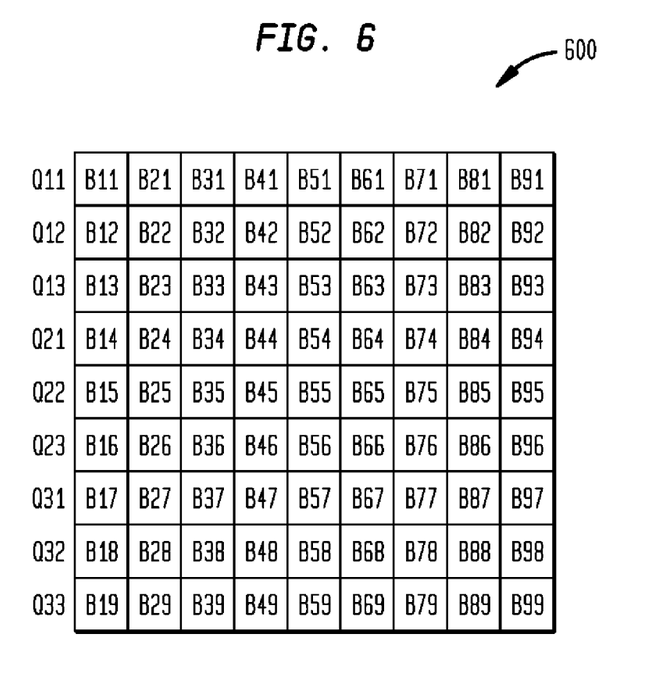
FIG. 6 illustrates an exemplary re-distribution of a resultant two-dimensional array after the first one-dimensional FFT of FIG. 5 according to the present invention.

FIG. 6 is an exemplary "all-to-all" re-distribution illustration 600 that depicts how each resulting row of elements transformed via the first-dimension FFT of FIG. 5 is re-distributed across the nodes Q11-Q33 for performing the second-dimension FFT according to the present invention. More particularly, each resulting row of elements that is distributed at each node Q11 ... Q33 of FIG. 5 is re-distributed over the Torus network 100 so that each successive node receives a successive column of elements as particularly depicted in FIG. 6. This efficient re-distribution is the "all-to-all" re-distribution, which enables an efficient implementation of the multidimensional FFT on the distributed-memory parallel supercomputer according to the present invention. For example, the first node Q11 receives the first column of elements, i.e., first elements from each of the nodes Q11 ... Q33. As another example, node Q12 receives the second column of elements, i.e., second elements from each of the nodes Q11 ... Q33. This redistribution is performed for each column in FIG. 5. In exemplary re-distribution of FIG. 6, the assignment of a particular node to a particular row of array elements is not fundamental. Instead, it is noted that any assignment is feasible. For various applications and/or computers, some assignments may take advantage of efficiencies offered by the applications and/or computers and thus produce faster execution than other assignments. For example, the fastest way to perform the multidimensional FFT may be to reverse the assignments of nodes Q11 and Q12 from those illustrated in FIG. 6. The description below with reference to FIGS. 9 and 10 particularly describes how the present invention performs the "all-to-all" re-distribution of array elements across the nodes of the supercomputer over the Torus network 100. The "all-to-all" re-distribution of the elements at each node Q11 ... Q33 is fast since it takes advantages of the communication characteristics of the Torus network 100. In the re-distribution illustrated in FIG. 6, each node from Q11 ... Q33 nodes sends a single array element to every other node. The following description assumes that each element of the array is a quantity of data larger than the quantity of data carried by a single packet. Thus, a plurality of packets is needed to transmit each element of the array to a destination node over the Torus network 100. This closely resembles the typical real-world re-distribution, where due to much larger array sizes, ea node sends many array elements to every other node, typically requiring many packets.

Figure 7:
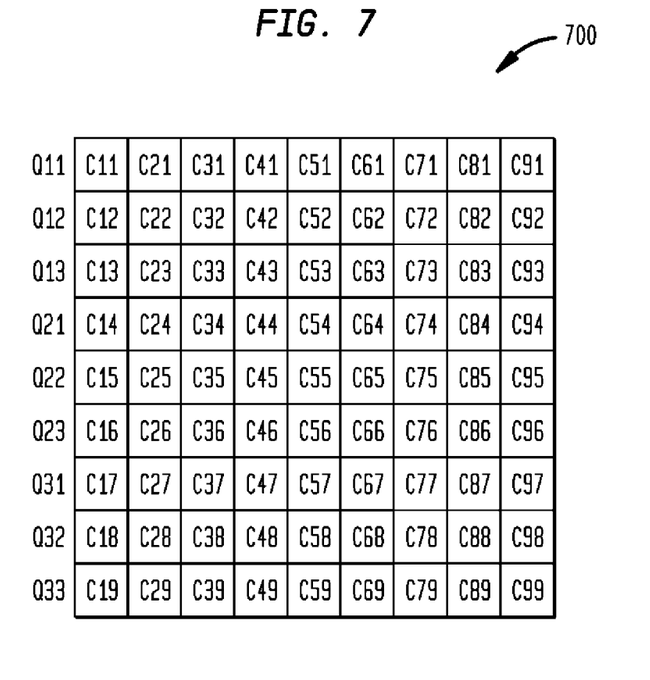
FIG. 7 illustrates an exemplary second one-dimensional FFT of the re-distributed array of FIG. 6 according to the present invention.

FIG. 7 is an exemplary illustration 700 that depicts a second one-dimensional FFT on the two-dimensional array of FIG. 6 that was redistributed across the nodes Q11-Q33 over the two-dimensional Torus network 100 of FIG. 1 according to the present invention. As particularly noted above, the multidimensional FFT according to the present invention is accomplished by performing a series of one-dimensional FFTs, where FIG. 7 depicts the second one-dimensional FFT in that series according to the present invention. Therefore, a one-dimensional FFT is performed on the column of elements that were distributed to each node as illustrated in FIG. 5. For example, a one-dimensional FFT is performed for the elements distributed at node Q11, i.e., elements B11, B21 ... B91 in FIG. 6 that were distributed as a row to node Q11 form the first column of FIG. 5. Additionally, one-dimensional FFTs are performed on rows of elements (i.e., distributed from successive columns of elements of FIG. 5) at each node Q12-Q33. The result of the one-dimensional FFT on each row is a row of the same length as particularly illustrated in FIG. 7. For example, a one-dimensional FFT performed on the first row at node Q11 of FIG. 6, which comprises elements B11, B21 ... A91, results in a first row at node Q11 of FIG. 7, which comprises elements C11, C21 ... C91. As mentioned above with regard to the first FFT, the one-dimensional FFT performed on each row at each node is independent of the one-dimensional FFT performed on any other row at another node. The particular distribution of data illustrated in FIG. 6 enables each node to perform the one-dimensional FFT on the row of elements distributed at that node, without communication with any other node on the Torus network 100 of FIG. 1. Therefore, since no communication is required between the nodes, these one-dimensional FFTs are performed fast.

Figure 8:
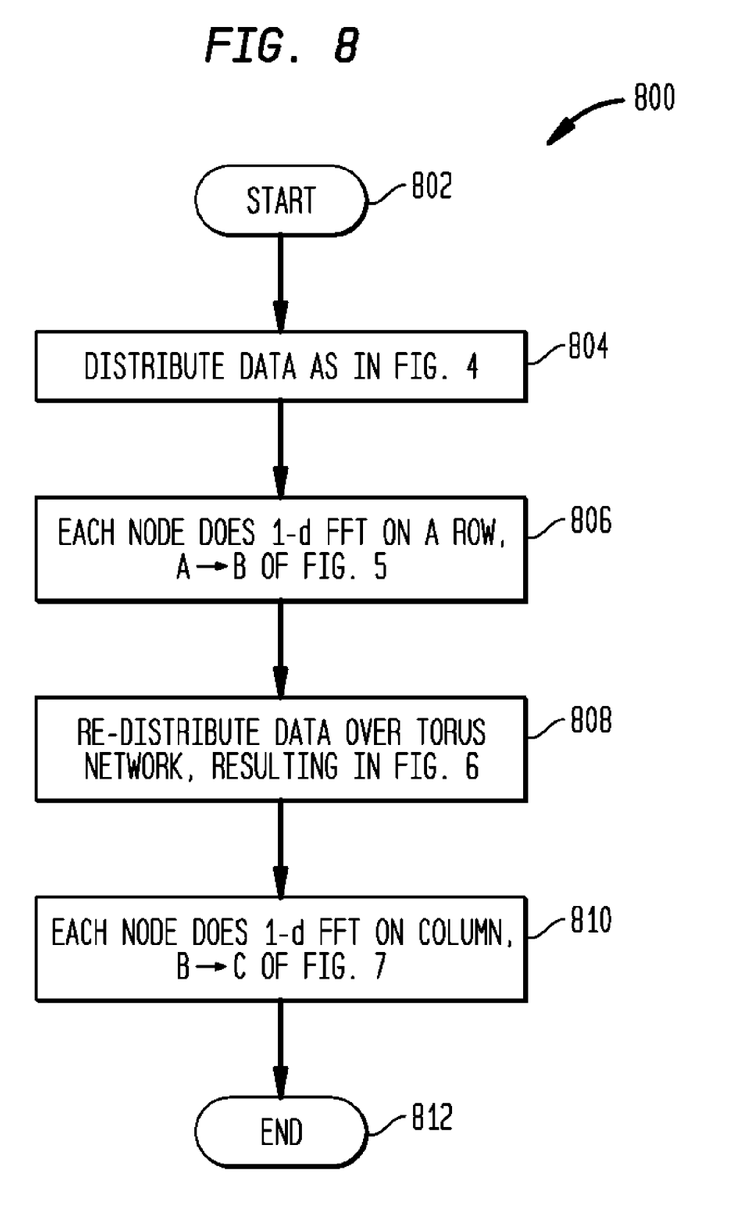
FIG. 8 illustrates an exemplary method flowchart depicting the implementation of the two-dimensional FFT illustrated in FIGS. 4-7 according to the present invention.

FIG. 8 is an exemplary method flowchart that illustrates the implementation of the two-dimensional FFT of an array on the distributed distributed-memory parallel supercomputer of FIG. 1 that utilizes a 2-dimensional Torus network 100 for communication between nodes Q11 ... Q33 of the supercomputer. In the following description, FIG. 8 is described on the basis of FIGS. 1-7 for efficiently performing the two-dimensional FFT. At step 802, the multi-dimensional FFT of a two-dimensional array illustrated in FIG. 3 in the distributed-memory parallel supercomputer of FIG. 1 is started. It is noted that at step 702, the array illustrated in FIG. 3 is distributed across the nodes in some arbitrary fashion that may be particular to an application. At step 804, elements (i.e., the data) of the array 300 are efficiently re-distributed across nodes Q11 ... Q33, as particularly illustrated in FIG. 4. At step 806, each node performs a first one-dimensional FFT (out of a series of one-dimensional FFTs) on a row of elements of the array stored at that node, as illustrated in FIG. 4, and the result particularly illustrated in FIG. 5. As described with regard to FIGS. 5 and 6, columns of one-dimensional FFT-transformed elements are re-distributed across the nodes Q11 ... Q33 of the supercomputer utilizing the Torus-based architecture of FIG. 1 at step 808. At step 810, each node performs a second one-dimensional FFT on a successive column of a first one-dimensional FFT-transformed elements illustrated of FIG. 6 that is distributed as a row of elements in FIG. 6. The result of the second one-dimensional FFT is illustrated in FIG. 7. At step 812, the multi-dimensional FFT of the two-dimensional array illustrated in FIG. 3 in the supercomputer of FIG. 1 is ended. As particularly described above, between the two one-dimensional FFTs there is a fast re-distribution of elements across the nodes Q11 ... Q33.

The above-described multidimensional FFT on an array of elements distributed across nodes of a distributed-memory parallel supercomputer coupled with redistribution of the elements across the nodes are illustrative of the invention. More particularly, the present invention utilizes efficient hardware routing of the Torus-based architecture coupled with a series of one-dimensional FFTs to achieve an efficient implementation of the multidimensional FFT on the distributed-memory parallel supercomputer. As noted above, the teachings according to the present invention may be utilized for performing efficient multidimensional FFTs in other number of array dimensions, in other array sizes, and in other number of Torus network dimensions, e.g., 3-dimensional Torus. Additionally, the teachings according to the present invention may be utilized for performing "all-to-all" communication between nodes of the distributed-memory parallel supercomputer on a Torus network of arbitrary dimensions.

Figure 9:
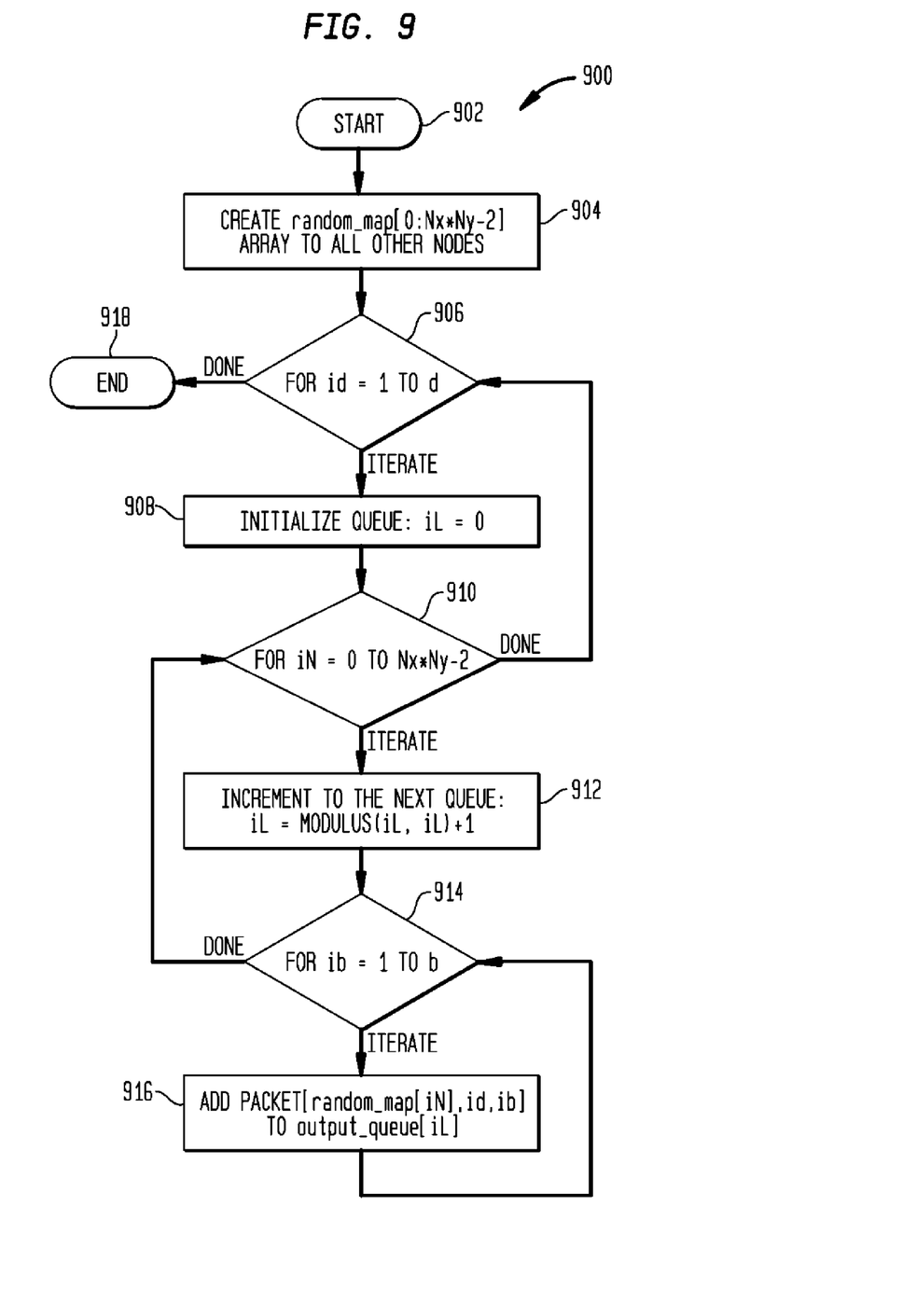
FIG. 9 illustrates an exemplary method flowchart that depicts the filling of output queues on the exemplary node with packets destined for other nodes on the distributed-memory parallel supercomputer according to the present invention.

FIG. 9 is an exemplary method flowchart 900 that depicts the filling of one or more output queues 212 on an exemplary node Q11 of FIG. 2 with packets destined for other nodes, e.g., nodes Q22 and Q33, on the distributed-memory parallel supercomputer according to the present invention. The "all-to-all" re-distribution illustrated in FIG. 6 above is implemented as follows according to the present invention. Assume that Qxy denotes a generic node (e.g., node Q11) with an x-coordinate value x and a y-coordinate value y (e.g., x=1; y=1). Thus, according to the "all-to-all" re-distribution, node Qxy (e.g., node Q11) needs to send a plurality of total packets (i.e., k packets) to every node Qab for all possible values of a and b (e.g., Q12, Q13; Q21, Q22, Q23; and Q31, Q32, Q33 as illustrated in FIG. 1; it is noted that Q11 does not send packets to itself). To perform the re-distribution as fast as possible, the grid links of the Torus network 100 must efficiently utilized. If packets are not scheduled in an efficient order, then the grid link utilization may be very inefficient. For example, if every node first sends packets only in the positive X+ direction, then all the grid links in the negative X− direction will be idle, hence the re-distribution will not be performed as fast as possible and the multifield FFT will not be implemented as efficiently W as possible. According to the present invention, the fast re-distribution takes advantage of the adaptive routing capability of the Torus-based network 100 such that packet scheduling is implemented efficiently, as particularly illustrated below.

Thus with reference to FIG. 9, there are Nx*Ny nodes interconnected by the Torus network 100 (i.e., 3×3=9 nodes in FIG. 1) that need to exchange packets, which include elements of the two-dimensional array. At step 902, the exemplary method starts. At step 904, at each node Q11 . . . Q33 there is created an array (i.e., random_map[ ] array) that assigns each node on the Torus network 100 a unique number between 0, . . . , Nx*Ny−2. Since a node does not send packets to itself, the total number of nodes that exchange packets are 0 to Nx*Ny−2. It is noted that the assignments at step 904 are generated randomly. At this point, assume that the total number of packets that a node requires to send an element of the array to another node is k packets (e.g., 6 packets). Thereafter, assume that total k packets=d iterations*b packets, where d is the number of iterations necessary to transmit b packets per iteration for a total number of k packets. It is noted that b may be chosen as necessary for efficiency and may likewise be equal to 1. For example, to transmit a total of 6 packets, it can be chosen to transmit 2 packets per iteration on each of 3 iterations for the total of 6 packets. Therefore, at step 906, a loop is initiated for id from 1 to d iterations. At step 908, a queue counter is initialized to zero. It is assumed that there are L output queues 212 (L being greater than or equal to 1) for storing packets (or short descriptors of the packets such that the actual packet need not be copied), and all packets (or descriptors of the packets) for a given destination will be placed into the same output queue. A particular output queue iL is selected in round-robin order at step 912 within nested loops of FIG. 9. At step 910, a loop is initialized for iN value from node 0 to node Nx*Ny−2, as an index into the array (i.e., random_array[ ]) created at step 904. As the array created in step 904 is indexed for a particular iN value, a random node value is obtained from the random_array. At step 912, a first queue is selected in round-robin order. At step 914, a loop is initialized for ib from 1 to b packets per d iterations. Subsequently, as steps 914 and 916, a plurality of b packets (e.g., b=2 packets from above example) destined for a given random node iN are added to the same output queue iL as packet [node, id, ib]. At step 918, once all d iterations have been completed, the method ends. In sum with reference to the flowchart 900, during one d iteration a particular node "i" (e.g., processor 202 on node Q11 of FIG. 2) will first place b number of packets that include data for an element of the array destined for a node Modulus (i+1, Nx*Ny−1) in a first output queue, then particular node "i" will place b packets that include data for an element of the array destined for a node Modulus (i+2,Nx*Ny−1) into a next output queue, and so on until reaching node Modulus (i+(Nx*Ny−1), Nx*Ny−1). When the packets b packets have been inserted for a given iteration into the output queues, this process is repeated until the d iterations have all been completed. The foregoing re-distribution achieves extremely high grid link utilization on the Torus network 100 of FIG. 1, thereby efficiently implementing the multidimensional FFT according to the present invention.

Figure 10:
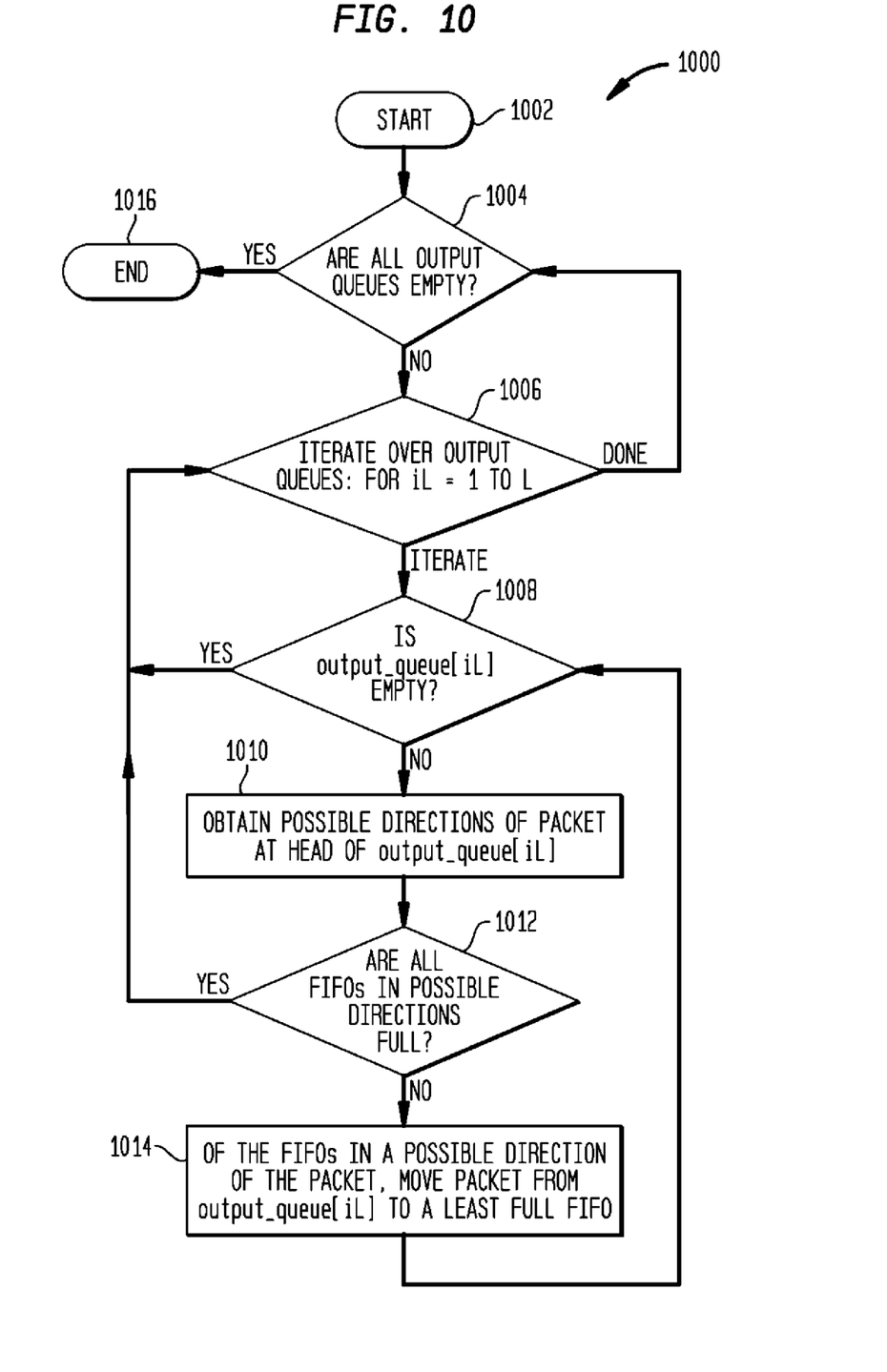
FIG. 10 illustrates an exemplary method flowchart that depicts how the packets in the output queues on the exemplary node are drained into injection FIFOs for subsequent insertion on the Torus network 100 according to the present invention.

FIG. 10 is an exemplary method flowchart 1000 that depicts how the packets in the one or more output queues 212 on the exemplary node Q11 of FIG. 2 are drained into the injection FIFOs 210 for subsequent insertion on the Torus network 100 according to the present invention. Before describing FIG. 10 in detail, it is noted that the filling of FIG. 9 and the draining of FIG. 10 may be performed concurrently with one another. At step 1002, the exemplary method starts. At step 1004 it is determined whether all L output queues 212 are empty. At step 1006 a loop is initiated for iL from 1 to L, to iterate over all L output queues. At step 1008 it is determined whether a particular output queue iL is empty. If the output queue iL is empty, the method continues to the next iL output queue at step 1006. Otherwise, at step 1010, for a packet at the head of the output queue iL, possible directions for routing the packet over the Torus network 100 are obtained. For example with reference to FIG. 1, assume that node Q11 placed a packet destined to node Q22 into an output queue iL. The packet may travel from node Q11 in the X+ direction (over grid link 108) followed by Y direction (over grid link 110) to reach node Q22, or it may travel in the Y−direction (over grid link 106) followed by the X+ direction (over grid link 112) to reach node Q22. Now back to FIG. 10, at step 1012 it is further determined whether all FIFOs 210 of FIG. 2 in the possible directions for the packet are full. As described above, each injection FIFO 210 has a logical direction (e.g., X+) associated with it, which represents that any packet placed in the injection FIFO 210 can move in the associated logical direction (e.g., X+ direction). If the injection FIFOs 210 for packet directions are full, then the method skips the current output queue and continues by iterating to the next output queue at step 1006. Otherwise, at step 1014, the packet is moved from the output queue to a least full FIFO 212 in one of the possible directions for that packet. It is noted that packets are removed from output the queues in a round-robin order for insertion into the injection FIFOs 210 illustrated in FIG. 2. After the packet is moved, the method continues at step 1008 for a next available packet in that output queue. Once all output queues are empty, the method ends at step 1016.

In order to more fully demonstrate FIGS. 9 and 10, which describe the "all-to-all" routing, assume that the row of elements at node Q11 in FIG. 5, i.e., elements B11, B12 . . . B19, are to be re-distributed across nodes Q12 . . . Q33 as illustrated in FIG. 6 over the Torus network 100. Assume that the random mapping of nodes has following values in random_map array={Q32; Q22; Q13; Q21; Q23; Q33; Q12; and Q31}. Therefore, the order of the array elements and their destination nodes from node Q11 is as follows: {B12 to Q12; B13 to Q13; B14 to Q21; B15 to Q22; B16 to Q23; B17 to Q31; B18 to Q32 and B19 to Q33}. The array elements are placed into the FIFOs 210 of node Q11 as follows: {B18 to Q32 via X+ or Y−; B15 to Q22 via X+ or Y+; B13 to Q13 via X−; B14 to Q21 via Y+; B16 to Q23 via Y+ or X−; B19 to Q33 via X− or Y−; B12 to Q12 via X+; and B17 to Q31 via Y−}. Thus for example, the FIFOs 210 on node Q11 might be filled as illustrated in the table 1 below.

TABLE 1

| X+ | X− | Y+ | Y− |
|---|---|---|---|
| B18 to Q32 | B13 to Q13 | B15 to Q22 | B14 to Q21 |
| B12 to Q12 | B19 to Q33 | B16 to Q23 | B17 to Q31 |

In order to more fully demonstrate FIGS. 9 and 10, which describe the "all-to-all" routing, assume that the row of elements at node Q11 in FIG. 5, i.e., elements B11 Notwithstanding the fact that the number of injection FIFOs was described above as equal to the number of grid links to a node (e.g., 4 FIFOs and 4 grid links), the use of an injection FIFO that is restricted to at least a particular grid link also is well-suited when number of injection FIFOs is not equal to the number of grid links. For example, if there are fewer injection FIFOs than grid links, then the use of a buffer may be restricted to at least one of several particular grid links. For another example, if there are more injection FIFOs than grid links, then there may be several injection FIFOs whose use is restricted to at least the same particular grid link.

Although the implementation of the array re-distribution was described above with reference to efficient implementation of the multidimensional FFT, the "all-to-all" re-distribution is also well suited for any type of array re-distributions over the Torus network 100 of FIG. 1.

While the invention has been particularly shown and described with regard to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A method for efficiently implementing a multidimensional Fast Fourier Transform (FFT) of a multidimensional array comprising a plurality of elements initially distributed in a multi-node computer system comprising a plurality of nodes in communication over a network, the method comprising:

(a) distributing the plurality of elements of the array in a first dimension across the plurality of nodes of the computer system over the network to facilitate a first one-dimensional FFT, said computer system comprising a distributed-memory parallel supercomputer, each of said plurality of nodes including at least one processor that operates on a local memory;

(b) performing the first one-dimensional FFT on the elements of the array distributed at each node in the first dimension;

(c) re-distributing the one-dimensional FFT-transformed elements at each node in a second dimension via "all-to-all" distribution in random order across other nodes of the computer system over the network; and (d) performing a second one-dimensional FFT on elements of the array re-distributed at each node in the second dimension, wherein the random order facilitates efficient utilization of the network thereby efficiently implementing the multidimensional FFT.

2. The method for efficiently implementing a multidimensional FFT according to claim 1, wherein the method further comprises the step of:

re-distributing the elements of the array at each node in a third dimension via the "all-to-all" distribution in random order across other nodes of the computer system over the network;

performing a one-dimensional FFT on elements of the array re-distributed at each node in the third dimension; and repeating the steps of re-distributing the elements of the array in random order across nodes and performing the one-dimensional FFT on the re-distributed elements at each node for subsequent dimensions.

3. The method for efficiently implementing a multidimensional FFT according to claim 1, wherein the method comprises a step of generating a random order of other nodes for re-distributing the one-dimensional FFT-transformed elements at each node.

4. The method for efficiently implementing a multidimensional FFT according to claim 3, wherein each of the plurality of elements is re-distributed between nodes of the computer system via a plurality of total packets.

5. The method for efficiently implementing a multidimensional FFT according to claim 4, wherein the method further comprises the steps of:

providing a plurality of output queues at each node;

iterating thru the other nodes in generated random order a plurality of times; and outputting to an output queue for each other node at least one packet of the plurality of total packets during each iteration.

6. The method for efficiently implementing a multidimensional FFT according to claim 5, wherein the method further comprises the steps of:

providing a plurality of injection first-in-first-out (FIFO) buffers, each FIFO buffer for transmitting packets in at least a particular direction on the network;

iterating through the plurality of output queues at a node to identify a packet at the head of each queue;

obtaining possible routing directions associated with the packet at the head of each queue; and moving the packet from the head of each queue to a least full FIFO buffer in one of the possible routing directions associated with the packet.

7. A system for efficiently implementing a multidimensional Fast Fourier Transform (FFT) of a multidimensional array comprising a plurality of elements initially distributed in a multi-node computer system comprising a plurality of nodes in communication over a network, the system comprising:

(a) means for distributing the plurality of elements of the array in a first dimension across the plurality of nodes of the computer system over the network to facilitate a first one-dimensional FFT, said computer system comprising a distributed-memory parallel supercomputer, each of said plurality of nodes including at least one processor that operates on a local memory;

(b) means for performing the first one-dimensional FFT on the elements of the array distributed at each node in the first dimension;

(c) means for re-distributing the one-dimensional FFT-transformed elements at each node in a second dimension via "all-to-all" distribution in random order across other nodes of the computer system over the network; and (d) means for performing a second one-dimensional FFT on elements of the array re-distributed at each node in the second dimension, wherein the random order facilitates efficient utilization of the network thereby efficiently implementing the multidimensional FFT.

8. The system for efficiently implementing a multidimensional FFT according to claim 7, wherein the method further comprises the step of:

means for re-distributing the elements of the array at each node in a third dimension via the "all-to-all" distribution in random order across other nodes of the computer system over the network;

means for performing a one-dimensional FFT on elements of the array re-distributed at each node in the third dimension; and means for repeating the steps of re-distributing the elements of the array in random order across nodes and performing the one-dimensional FFT on the re-distributed elements at each node for subsequent dimensions.

9. The system for efficiently implementing a multidimensional FFT according to claim 7, wherein the systems comprises a means for generating a random order of other nodes for re-distributing the one-dimensional FFT-transformed elements at each node.

10. The system for efficiently implementing a multidimensional FFT according to claim 9, wherein each of the plurality of elements is re-distributed between nodes of the computer system via a plurality of total packets.

11. The system for efficiently implementing a multidimensional FFT according to claim 10, wherein the method further comprises the steps of:

means for providing a plurality of output queues at each node;

means for iterating thru the other nodes in generated random order a plurality of times; and means for outputting to an output queue for each other node at least one packet of the plurality of total packets during each iteration.

12. The system for efficiently implementing a multidimensional FFT according to claim 11, wherein the method further comprises the steps of:

means for providing a plurality of injection first-in-first-out (FIFO) buffers, each FIFO buffer for transmitting packets in at least a particular direction on the network;

means for iterating through the plurality of output queues at a node to identify a packet at the head of each queue;

means for obtaining possible routing directions associated with the packet at the head of each queue; and means for moving the packet from the head of each queue to a least full FIFO buffer in one of the possible routing directions associated with the packet.

13. A program storage device, tangibly embodying a program of instructions executable by a machine to perform a method for efficiently implementing a multidimensional Fast Fourier Transform (FFT) of a multidimensional array comprising a plurality of elements initially distributed in a multi-node computer system comprising a plurality of nodes in communication over a network, the method comprising:

(a) distributing the plurality of elements of the array in a first dimension across the plurality of nodes of the computer system over the network to facilitate a first one-dimensional FFT, said computer system comprising a distributed-memory parallel supercomputer, each of said plurality of nodes including at least one processor that operates on a local memory;

(b) performing the first one-dimensional FFT on the elements of the array distributed at each node in the first dimension;

(c) re-distributing the one-dimensional FFT-transformed elements at each node in a second dimension via "all-to-all" distribution in random order across other nodes of the computer system over the network; and (d) performing a second one-dimensional FFT on elements of the array re-distributed at each node in the second dimension, wherein the random order facilitates efficient utilization of the network thereby efficiently implementing the multidimensional FFT.

14. The program storage device for efficiently implementing a multidimensional FFT according to claim 13, wherein the method further comprises the step of:

re-distributing the elements of the array at each node in a third dimension via the "all-to-all" distribution in random order across other nodes of the computer system over the network;

performing a one-dimensional FFT on elements of the array re-distributed at each node in the third dimension; and repeating the steps of re-distributing the elements of the array in random order across nodes and performing the one-dimensional FFT on the re-distributed elements at each node for subsequent dimensions.

15. The program storage device for efficiently implementing a multidimensional FFT according to claim 13, wherein the method comprises a step of generating a random order of other nodes for re-distributing the one-dimensional FFT-transformed elements at each node.

16. The program storage device for efficiently implementing a multidimensional FFT according to claim 15, wherein each of the plurality of elements is re-distributed between nodes of the computer system via a plurality of total packets.

17. The program storage device for efficiently implementing a multidimensional FFT according to claim 16, wherein the method further comprises the steps of:

providing a plurality of output queues at each node;

iterating thru the other nodes in generated random order a plurality of times; and outputting to an output queue for each other node at least one packet of the plurality of total packets during each iteration.

18. The program storage device for efficiently implementing a multidimensional FFT according to claim 17, wherein the method further comprises the steps of:

providing a plurality of injection first-in-first-out (FIFO) buffers, each FIFO buffer for transmitting packets in at least a particular direction on the network;

iterating through the plurality of output queues at a node to identify a packet at the head of each queue;

obtaining possible routing directions associated with the packet at the head of each queue; and moving the packet from the head of each queue to a least full FIFO buffer in one of the possible routing directions associated with the packet.

19. A method for efficiently re-distributing a multidimensional array comprising a plurality of elements initially distributed in a multi-node computer system comprising a plurality of nodes in communication over a network, the method comprising re-distributing the elements at each node via "all-to-all" distribution in random order across other nodes of the computer system over the network, wherein the random order facilitates efficient utilization of the network, said computer system comprising a distributed-memory parallel supercomputer, each of said plurality of nodes including at least one processor that operates on a local memory.

20. The method for efficiently re-distributing a multidimensional array according to claim 19, wherein the method comprises a step of generating a random order of other nodes for re-distributing the elements at each node.

21. The method for efficiently re-distributing a multidimensional array according to claim 20, wherein each of the plurality of elements is re-distributed between nodes of the computer system via a plurality of total packets.

22. The method for efficiently re-distributing a multidimensional array according to claim 21, wherein the method further comprises the steps of:

providing a plurality of output queues at each node;

iterating thru the other nodes in generated random order a plurality of times; and outputting to an output queue for each other node at least one packet of the plurality of total packets during each iteration.

23. The method for efficiently re-distributing a multidimensional array according to claim 22, wherein the method further comprises the steps of:

providing a plurality of injection first-in-first-out (FIFO) buffers, each FIFO buffer for transmitting packets in at least a particular direction on the network;

iterating through the plurality of output queues at a node to identify a packet at the head of each queue;

obtaining possible routing directions associated with the packet at the head of each queue; and moving the packet from the head of each queue to a least full FIFO buffer in one of the possible routing directions associated with the packet.

24. A system for efficiently re-distributing a multidimensional array comprising a plurality of elements initially distributed in a multi-node computer system comprising a plurality of nodes in communication over a network, the system comprising a means for re-distributing the elements at each node via "all-to-all" distribution in random order across other nodes of the computer system over the network, wherein the random order facilitates efficient utilization of the network, said computer system comprising a distributed-memory parallel supercomputer, each of said plurality of nodes including at least one processor that operates on a local memory.

25. The system for efficiently re-distributing a multidimensional array according to claim 24, wherein the method comprises a means for generating a random order of other nodes for re-distributing the elements at each node.

26. The system for efficiently re-distributing a multidimensional array according to claim 25, wherein each of the plurality of elements is re-distributed between nodes of the computer system via a plurality of total packets.

27. The system for efficiently re-distributing a multidimensional array according to claim 26, wherein the system further comprises:

means for providing a plurality of output queues at each node;

means for iterating thru the other nodes in generated random order a plurality of times; and means for outputting to an output queue for each other node at least one packet of the plurality of total packets during each iteration.

28. The system for efficiently re-distributing a multidimensional array according to claim 27, wherein the system further comprises:

means for providing a plurality of injection first-in-first-out (FIFO) buffers, each FIFO buffer for transmitting packets in at least a particular direction on the network;

means for iterating through the plurality of output queues at a node to identify a packet at the head of each queue;

means for obtaining possible routing directions associated with the packet at the head of each queue; and moving the packet from the head of each queue to a least full FIFO buffer in one of the possible routing directions associated with the packet.

29. A program storage device, tangibly embodying a program of instructions executable by a machine to perform a method for efficiently re-distributing a multidimensional array comprising a plurality of elements initially distributed in a multi-node computer system comprising a plurality of nodes in communication over a network, the method comprising re-distributing the elements at each node via "all-to-all" distribution in random order across other nodes of the computer system over the network, wherein the random order facilitates efficient utilization of the network, said computer system comprising a distributed-memory parallel supercomputer, each of said plurality of nodes including at least one processor that operates on a local memory.

30. The program storage device for efficiently re-distributing a multidimensional array according to claim 29, wherein the method comprises a step of generating a random order of other nodes for re-distributing the elements at each node.

31. The program storage device for efficiently re-distributing a multidimensional array 29, wherein each of the plurality of elements is re-distributed between nodes of the computer system via a plurality of total packets.

32. The program storage device for efficiently re-distributing a multidimensional array according to claim 31, wherein the method further comprises the steps of:

providing a plurality of output queues at each node;

iterating thru the other nodes in generated random order a plurality of times; and outputting to an output queue for each other node at least one packet of the plurality of total packets during each iteration.

33. The program storage device for efficiently re-distributing a multidimensional array according to claim 32, wherein the method further comprises the steps of:

providing a plurality of injection first-in-first-out (FIFO) buffers, each FIFO buffer for transmitting packets in at least a particular direction on the network;

iterating through the plurality of output queues at a node to identify a packet at the head of each queue;

obtaining possible routing directions associated with the packet at the head of each queue; and moving the packet from the head of each queue to a least full FIFO buffer in one of the possible routing directions associated with the packet.

* * * * *